United States Patent
Horng

(10) Patent No.: US 10,132,890 B2
(45) Date of Patent: Nov. 20, 2018

(54) SYSTEM AND METHOD FOR CONTROLLING UNDESIRED MAGNETIC FIELD EFFECTS IN MAGNETIC RESONANCE IMAGING

(71) Applicant: Wisconsin Alumni Research Foundation, Madison, WI (US)

(72) Inventor: Debra E. Horng, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 287 days.

(21) Appl. No.: 15/074,515

(22) Filed: Mar. 18, 2016

(65) Prior Publication Data

US 2017/0269179 A1 Sep. 21, 2017

(51) Int. Cl.
*G01V 3/00* (2006.01)
*G01R 33/44* (2006.01)
*G01R 33/565* (2006.01)

(52) U.S. Cl.
CPC ..... *G01R 33/443* (2013.01); *G01R 33/56545* (2013.01)

(58) Field of Classification Search
CPC ............ G01R 33/4816; G01R 33/4818; G01R 33/482; G01R 33/4822; G01R 33/4824; G01R 33/4826; G01R 33/4828; G01R 33/483; G01R 33/4831; G01R 33/4833; G01R 33/4835; G01R 33/46; G01R 33/4608; G01R 33/4616; G01R 33/4625; G01R 33/4633; G01R 33/4641; G01R 33/465; G01R 33/543; G01R 33/56; G01R 33/5602

See application file for complete search history.

(56) References Cited

U.S. PATENT DOCUMENTS

| 4,745,364 | A | * | 5/1988 | Hatanaka | G01R 33/482 |
| | | | | | 324/309 |
| 2010/0148774 | A1 | * | 6/2010 | Kamata | G01R 33/243 |
| | | | | | 324/309 |
| 2012/0153950 | A1 | * | 6/2012 | Katscher | G01R 33/4824 |
| | | | | | 324/307 |

OTHER PUBLICATIONS

Sun et al.; Background Field Removal Using Spherical Mean Value Filtering and Tikhonov Regularization; Magnetic Resonance in Medicine; 71:1151-1157 (2014).

(Continued)

*Primary Examiner* — Tung X Nguyen
(74) *Attorney, Agent, or Firm* — Quarles & Brady LLP

(57) ABSTRACT

A system and method are provided for determining a spatial distribution of susceptibility in a subject using a magnetic resonance imaging (MRI) system. The method includes directing the MRI system to acquire imaging data from an imaging volume within a subject, wherein the imaging volume is subject to both background fields ($B_B$) originating outside the imaging volume and local fields ($B_L$) originating from tissue within the imaging volume. The method also includes selecting a size and non-central compute point for an extended Poisson kernel to be applied to the imaging data, subtracting from a delta function to control the background fields ($B_B$) but not the local fields ($B_L$), and producing a susceptibility report attributable to the local fields ($B_L$).

20 Claims, 6 Drawing Sheets

(56) References Cited

OTHER PUBLICATIONS

Topfer et al.; SHARP Edges: Recovering Cortical Phase Contrast Through Harmonic Extension; Magnetic Resonance in Medicine (2014).
Schweser et al.; Quantitative Imaging of Intrinsic Magnetic Tissue Properties Using MRI Signal Phase; An Approach to in Vivo Brain Iron Metabolism; Science Direct—Neuroimage; 54: 2789-2807 (2011).
Liu et al.; A Novel Background Field Removal Method for MRI Using Projection Onto Dipole Fields (PDF); MNR in Biomedicine; 24: 1129-1136 (2011).

\* cited by examiner

SYSTEM AND METHOD FOR CONTROLLING UNDESIRED MAGNETIC FIELD EFFECTS IN MAGNETIC RESONANCE IMAGING

STATEMENT REGARDING FEDERALLY SPONSORED RESEARCH

This invention was made with government support under DK100651, DK088925, DK102595, DK083380, and TR000427 awarded by the National Institutes of Health. The government has certain rights in the invention.

BACKGROUND OF THE INVENTION

The present disclosure relates to systems and methods for magnetic resonance imaging ("MRI"). More particularly, the disclosure relates to systems and methods for controlling undesired magnetic field effects when performing an MRI study.

Iron is a naturally-occurring element in the human body. Iron is an essential nutrient for the human body; however, excessive iron is toxic, and the body has very limited capabilities to eliminate abnormal accumulation of iron. Iron overload can result in multiple complications.

For example, "transfusional" iron overload can be experienced by patients that require regular blood transfusions. Treatment for transfusional iron overload is based on administering iron-reducing "chelator" agents (chemicals that bind to excess iron and remove it from the body), either orally or intravenously. Treatment with chelators is extremely expensive and can exceed $40,000 per year and is potentially toxic. Therefore, in even this particular patient base, accurate measurement of body iron levels is critical to determine when to initiate treatment. It is also important to monitor treatment, allowing the adjustment of chelator dose to maintain low iron levels while minimizing risks from the treatment.

Current MRI-based iron quantification methods fall into one of two categories: quantitative susceptibility mapping (QSM) and relaxometry (e.g., measuring T2*) techniques. QSM is an MRI technique that provides a quantitative measure of tissue magnetic susceptibility and, thereby, iron concentration. Though relaxometry methods can also be used to assess iron concentration, in theory, QSM provides greater accuracy because it relies on direct measurement, rather than relaxometry measurements that are then correlated to iron quantification. However, in practice, the accuracy of QSM measurements can be compromised by a variety of confounding factors.

For example, magnetic fields from surrounding tissue or other sources can present "background fields" that interfere with the accurate assessment of tissue susceptibility in a given region of interest (ROI). The physical origin of the background field includes field inhomogeneity (imperfect shimming) in the B0 field, and susceptibility sources outside the ROI. For example, in brain imaging the magnetic field measured on frontal lobe may be particularly challenging because it includes fields induced by the frontal lobe (ROI), as well as fields induced by the skull and nasal cavity. Accordingly, if the magnetic field estimated from the MRI data includes information about fields induced outside the ROI (i.e., background fields), the QSM analysis may be influenced by these background fields. To overcome the confounding problems presented by background fields, various procedures referred to generally as background field removal have been developed.

Background field removal methods fall into two main categories: that include (1) algorithms based on harmonic function theory and (2) algorithms fitting the field with a series of basis functions. The first category of methods has fast performance relative to the second category, since the first can be implemented analytically, while the second must be implemented iteratively. One example of the former category includes sophisticated harmonic artifact reduction on phase data (SHARP), as described in Schweser, F., Deistung, A., Lehr, B. W., Reichenbach, J. R. (2011). "Quantitative imaging of intrinsic magnetic tissue properties using MRI signal phase: an approach to in vivo brain iron metabolism?". NeuroImage 54 (4): 2789-2807. An example of the latter category includes projection onto dipole fields (PDF), as described in Liu, T, Khalidov, I., de Rochefort, L., Spincemaille, P., et al. (2011), "A novel background field removal method for MRI using projection onto dipole fields". NMR in Biomedicine 24 (9): 1129-36.

These methods have been evaluated for accuracy in the context of brain imaging. In the brain, structures of interest for susceptibility mapping to date have been small, located deep within tissue, far from air within sinuses, and have susceptibilities on the order of 0.3 ppm. This stands in contrast to ROIs in the abdomen, where the structures of interest include the liver, spleen, and pancreas. Abdominal structures have important differences from the brain. For example, the liver is large, has tissue adjoining air in the lungs, and can have susceptibility differences up to 9 ppm or more.

There continues to be a need for systems and methods to address background fields, particularly as the size of the ROI increases to accommodate larger structures, the structures are closer to an air interface, and the difference between a structure's susceptibility and the surrounding tissue's susceptibility is substantial.

SUMMARY

The present disclosure provides systems and methods that overcome the aforementioned drawbacks by using harmonic function theory to correct for background field effects. Background fields, when treated as harmonic, can be removed by convolving and deconvolving the total field with a constant spherical kernel. The susceptibility can then be estimated via dipole inversion of the local field. With the background field removed, even in the presence of nearby air-tissue interfaces or substantial susceptibility differences proximate an ROI, susceptibility mapping can be performed with substantial accuracy. Furthermore, the system and method provides great flexibility by allowing selection of a "compute point" specific to spatial orientation of the ROI and surrounding structures. Thus, the process can be adjusted based on the particular clinical application or anatomical ROI.

In accordance with one aspect of the disclosure, a method is provided for determining a spatial distribution of susceptibility in a subject using a magnetic resonance imaging (MRI) system. The method includes directing the MRI system to acquire imaging data from an imaging volume within a subject, wherein the imaging volume is subject to both background fields ($B_B$) originating outside the imaging volume and local fields ($B_L$) originating from tissue within the imaging volume. The method also includes selecting a size and non-central compute point for an extended Poisson kernel to be applied to the imaging data, subtracting from a delta function to control the background fields ($B_B$) but not the local fields ($B_L$), and producing a susceptibility report attributable to the local fields ($B_L$).

In accordance with another aspect of the disclosure, a magnetic resonance imaging (MRI) system is provided that includes a static magnetic field configured to be applied across at least an imaging volume of a subject to be imaged. The MRI system also includes a gradient system configured to apply gradient fields to the imaging volume of the subject to be imaged, a radio frequency (RF) system configured to deliver RF energy to the subject and receive imaging data from the subject during an imaging process, and a computer system. The computer system is configured to control the gradient system and the RF system to perform the imaging process and acquire the imaging data from the imaging volume of the subject. The imaging volume is subject to both background fields ($B_B$) originating outside the imaging volume and local fields ($B_L$) originating from tissue within the imaging volume. The computer system is also configured to selecting a size and non-central compute point for an extended Poisson kernel to be applied to the imaging data, produce a magnetic susceptibility map of the imaging volume having suppressed the background fields ($B_B$) but not the local fields ($B_L$), and, using the magnetic susceptibility map, generate a quantitative susceptibility map of the imaging volume.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Figure 1:
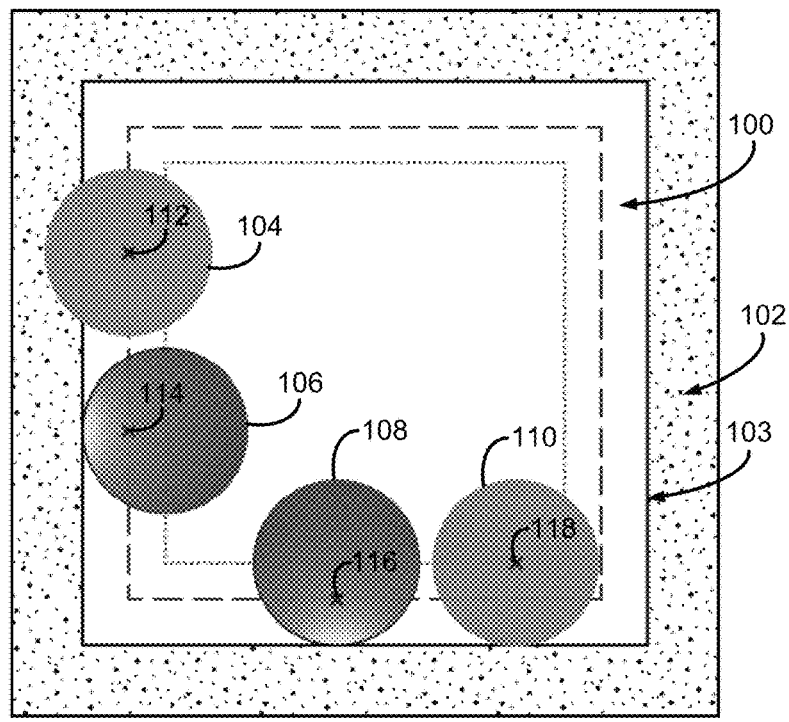
FIG. 1 is a schematic illustration of a volume of interest and example kernels arranged thereon, including kernels in accordance with the present disclosure.

The magnetic susceptibility of tissue distorts the magnetic field observed in MRI. This local field, or "distortion field" ($B_L$) can be represented as the convolution ($\otimes$) of a known dipole response function (d) with the tissue magnetic susceptibility map ($\chi$) as given by:

$$B_L = d \otimes \chi \qquad \text{Eqn. 1}$$

However, the measured magnetic field also contains contributions from the background field ($B_B$) that includes fields from magnet imperfections, shim fields, and "MR-invisible" sources such as air. Thus, the total measured field ($B_T$) is given by the sum of the background field $B_B$ and the local field $B_L$:

$$B_T = B_B + B_L \qquad \text{Eqn. 2}$$

As described, quantitative susceptibility mapping (QSM) relies on direct measurement of tissue magnetic susceptibility, the accuracy of QSM measurements can be compromised by a variety of confounding factors background fields. Thus, a critical step of traditional QSM algorithms is the performance of background field removal, which is generally an attempt to estimate of $B_L$ from the measured $B_T$. Multiple background field removal techniques have been proposed in recent years, based on imposing different assumptions to isolate $B_L$. Several techniques are based on the observation that $B_B$ is a harmonic function, whereas $B_L$ is generally not harmonic. Harmonic functions have the property that they remain unchanged when convolved with certain kernels (p), such that:

$$u(\vec{x}) = u(\vec{x}) \otimes p(\vec{x}) \qquad \text{Eqn. 3}$$

This approach is the basis of the sophisticated harmonic artifact reduction on phase data (SHARP) method, such as described by Schweser F, Deistung A, Lehr B W, Reichenbach J R. Quantitative imaging of intrinsic magnetic tissue properties using MRI signal phase: an approach to in vivo brain iron metabolism? Neuroimage 2011; 54:2789-2807, which is incorporated herein by reference in its entirety. For a suitable choice of p, the total measured field $B_T$ can be convolved with ($\delta$-p), where $\delta$ is a delta function, to eliminate the background field $B_B$ but not the desired local field $B_L$. Thus, p can be selected such as:

$$(\delta-p) \otimes B_T = (\delta-p) \otimes B_B + (\delta-p) \otimes B_L = (\delta-p) \otimes B_L \qquad \text{Eqn. 4}$$

Subsequently, estimation of the local field requires deconvolution of ($\delta$-p):

$$B_L = (\delta-p) \otimes^{-1} [(\delta-p) \otimes B_T] \qquad \text{Eqn. 5}$$

where deconvolution is denoted by the symbol $\otimes^{-1}$. Thus, the SHARP kernel is given by $\delta$-p. Note that the convolution and deconvolution may be implemented as a multiplication and division in Fourier space. Importantly, the deconvolution is often considered an ill-posed operation requiring regularization. Different background field removal techniques have been proposed based on different approaches to regularization, such as thresholded k-space (TKD) or Tikhonov regularization.

One kernel satisfying Eqn. 3 for harmonic functions is the (normalized) indicator function for a ball centered at the origin, given by:

$$S(\vec{x}) = \begin{cases} \dfrac{1}{\frac{4}{3}\pi a^3}, & \text{if } |\vec{x}| \le a \\ 0, & \text{otherwise} \end{cases} \qquad \text{Eqn. 6}$$

as can be shown from the volume version of the spherical mean value theorem from harmonic function theory. Based on this theorem, the value of a harmonic function at any point is the average of the values within a sphere centered on that point.

Using this particular choice of kernel, the SHARP technique has been used for background field removal in QSM. Although this choice of kernel used in SHARP has been shown to perform well in brain imaging applications of QSM, it has important limitations, particularly near tissue-air interfaces where the convolution kernel will overlap with regions, such as those containing air, where the magnetic field $B_T$ is unknown. This limitation has been recognized and a modified version of the algorithm, termed RESHARP, has been proposed in Sun H, Wilman A H. Background field removal using spherical mean value filtering and Tikhonov regularization. Magn Reson Med 2014; 71:1151-1157, which is incorporated herein by reference in its entirety. RESHARP attempts to determine the local fields by iteratively minimizing the SHARP cost function using a conjugate gradient method. Unfortunately, RESHARP still fails due to the underlying expansion itself when approaching the edge of the volume of interest. The location at which SHARP computes the value (the "compute point") is at the center of a constant spherical kernel. Therefore, voxels near the edge of the VOI must be eroded by the radius of the kernel. However, many important abdominal organs (liver, pancreas) are located closer to air-tissue interfaces.

Thus, current background field methods, including Laplacian Boundary Values (LBV), SHARP, Regularization Enabled SHARP (RESHARP), and Projection onto Dipole Fields (PDF) have shortcomings. This point is illustrated in FIG. 1. Specifically, FIG. 1 is an illustration of an area of tissue 100 surrounded by air 102 to create an air-tissue interface 103. A plurality of spherical kernels 104, 106, 108, 110 with respect respective compute points 112, 114, 116, 118 are arranged about the tissue 100. As illustrated, a spherical kernel 104 with a central compute point 112 that causes the kernel 104 to extend into the air 102, will suffer from the change in background field at the air-tissue interface 103. Even when the spherical kernel 110 with a central compute point 118 is arranged perfectly to not extend past the air-tissue interface 103, the influence of the background field about the air-tissue interface 103 will cause the computed value to be inaccurate.

The present disclosure provides a new system and methods for background field removal that provides greater flexibility and superior abilities to control the influence of background fields than traditional methods, including SHARP, RESHARP, and other methods. The present disclosure recognizes that computing the value at the center of a spherical kernel is not always desirable, such as near the edges of the VOI, where the kernel limits accuracy. Thus, the present disclosure recognizes that, as one moves a compute point 114, 116, away from the center of a kernel 106, 108, computation can be improved at points closer to air-tissue interfaces 103.

In accordance with one aspect of the disclosure, the recognition that $B_B$ may be treated as a harmonic function, whereas $B_L$ is generally not harmonic and that the harmonic functions have the property that they remain unchanged when convolved with certain kernels (p), is retained. As will be described, in accordance with the present disclosure, a new type of kernel, which is a modified version of the Poisson kernel for the ball, may be used for total field estimations. This new technique may be referred to herein as the Poisson estimation for ascertaining local field (PEAL).

The present disclosure determined that the Poisson kernel for the ball can be used to satisfy Eqn. 3. The traditional Poisson kernel for the ball is defined over the surface area of a sphere. However, in accordance with the present disclosure a normalized "extended Poisson kernel" may be used, which is defined over the volume of a sphere. The value of a harmonic function at any point $\vec{x}$ (not constrained to be the center point) within a sphere of radius 1 with volume $V = 4/3\pi$ is given by:

$$u(\vec{x}) = \frac{1}{V} \int_V u(\vec{x} + \vec{r}) P_0(\vec{x}, \vec{r}) d\vec{r}; \qquad \text{Eqn. 7}$$

where the extended Poisson kernel for the ball $P_0$ is given by:

$$P_0(\vec{x}, \vec{r}) = \begin{cases} \dfrac{1 - |\vec{x}|^2 |\vec{r}|^2}{\left(1 - 2\vec{x} \cdot \vec{r} + |\vec{x}|^2 |\vec{r}|^2\right)^{3/2}} & \text{if } |\vec{x}| < 1 \text{ and } |\vec{r}| \le 1 \\ 0, & \text{otherwise} \end{cases} \qquad \text{Eqn. 8}$$

Eqn. 7 may be written as a convolution:

$$u(\vec{x}) = u(\vec{x}) \otimes P(\vec{r}) \qquad \text{Eqn. 9}$$

where $\vec{r}$ is the compute point and the kernel P is given by $P_0/V$. In other words, a harmonic function will remain unchanged upon convolution with this kernel $P(\vec{x})$, just as a harmonic function convolved with the kernel $S(\vec{x})$ will.

Unlike the $S(\vec{x})$ kernel, which weights all voxels in the sphere equally, the $P(\vec{x})$ kernel weights voxels unequally. In particular, the $P(\vec{x})$ kernel can be used to weight voxels closer to $\vec{x} = \vec{r}$ more strongly. Thus, weighting can be performed to reduce or control the influence of air or other tissue interfaces that can create undesirable background fields. Advantageously, the $P(\vec{x})$ kernel can compute any point within the sphere, whereas with the traditional $S(\vec{x})$ kernel, only the central point of the sphere may be computed. Therefore, using a $P(\vec{x})$ kernel near an air/tissue interface, voxels closer to the interface can be computed than would be possible with an $S(\vec{x})$ kernel of the same radius. As will be explained, this provides decided advantages when looking to control background fields, such as is necessary for accurate performance of QSM.

The use of the extended Poisson kernel for QSM background field removal in accordance with the present disclosure will be referred to herein as the PEAL technique. Analogously to the SHARP method, the PEAL kernel is constructed by sampling the continuous extended Poisson kernel at discrete points given by $\vec{X}$ and $\vec{R}$:

$$\hat{P}_0[\vec{X}, \vec{R}] = \frac{3}{4\pi a^3} P_0(\vec{x}a, \vec{r}a); \qquad \text{Eqn. 10}$$

where a is the radius (in voxels), then subtracting from a delta function:

$$P[\vec{X}, \vec{R}] = \delta - \hat{P}_0[\vec{X}, \vec{R}] \qquad \text{Eqn. 11}$$

Notice that $P_0(\vec{x}, 0) = 1$. That is, all the points have equal weighting. Therefore, the compute point=0 of an extended Poisson kernel is equal to the spherical mean value kernel of the same radius. Thus, advantageously, the PEAL technique can be reduced to the SHARP technique when the compute point is chosen to be in the center. Thus, the PEAL technique provides substantial advantages not available in prior techniques, but can be selectively chosen to reduce to prior techniques, such as the SHARP technique, by placing the compute point at the center. Since placing the compute point away from the kernel center allows computation of field map values closer to the edge of the VOI, the PEAL technique enables more accurate background field removal at the edges of a volume.

In accordance with one non-limiting example, an extended Poisson kernel was created in continuous space. The effect of different discrete compute points was simulated by using $\vec{R}$=0, 1, 2, 3, 4 voxels in the +x-direction, and a=6 voxels. The specific continuous-space kernel used to generate the PEAL kernel is determined by the ratio of the distance between compute point and sphere center to the radius; a 6PEAL2 (radius=6, compute point=2 from center) kernel is equivalent to a 12PEAL4 kernel, neglecting sampling and discretization effects. Though in this example a radius of 6 is described, the extended Poisson kernel and PEAL technique are not limited to a particular radius. That is, in accordance with the present disclosure, a substantially greater radius (e.g., 40) or substantially smaller radius (e.g., 2) can be used. A SHARP kernel cannot estimate voxels that lie within half a kernel radius of an edge and, thus, is limited at an edge.

Figure 2A:
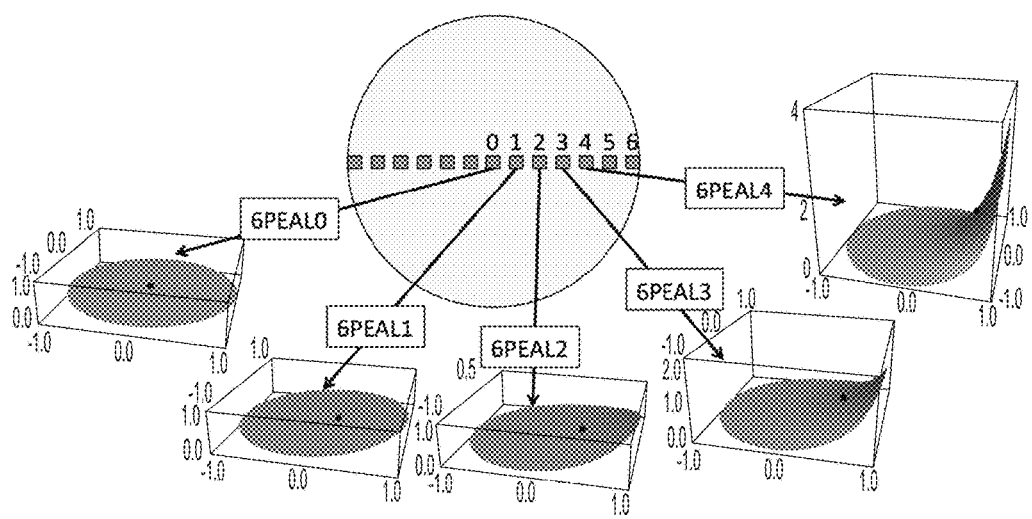
FIG. 2A is a graphical illustration of kernel functional with a plurality of compute points in accordance with the present disclosure.
Figure 2B:
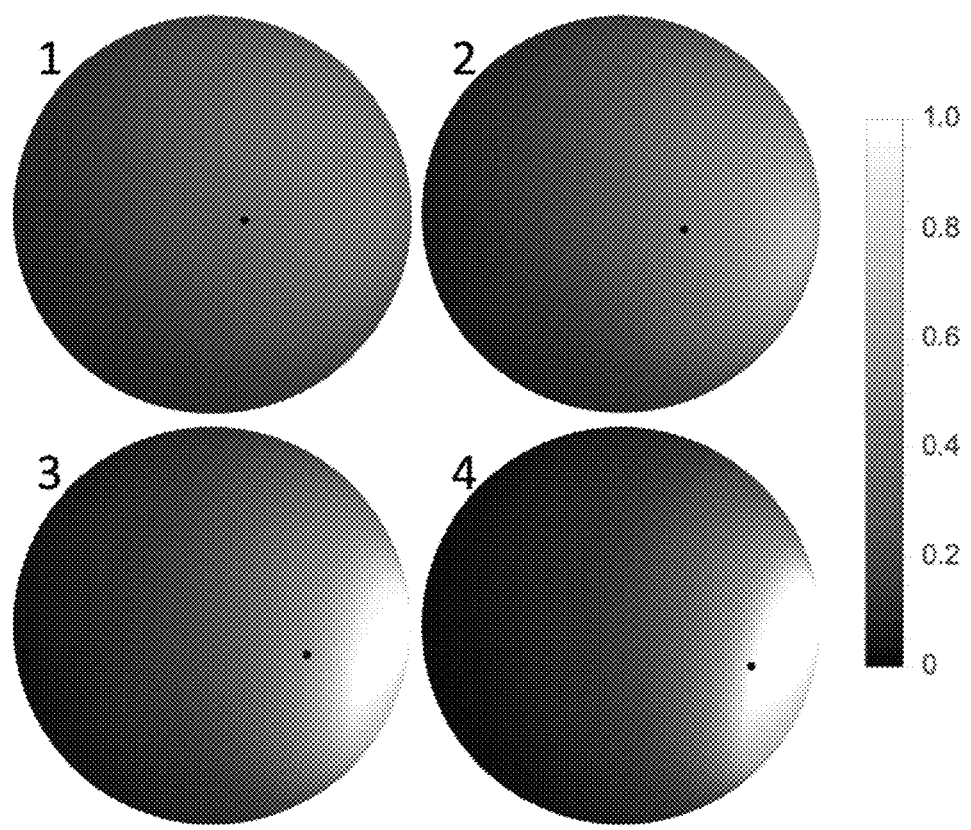
FIG. 2B is a graphical illustration of a kernel with different compute points in accordance with the present disclosure.

As illustrated in FIGS. 2A and 2B, the farther off-center the compute point was located, the kernel values are more unequal. Referring to FIG. 2A, it can be seen that the choice of compute point affects the values of the kernel. The central slice of a continuous extended Poisson kernel is shown for the corresponding PEAL radius=6 voxels, compute points (shown by black dot) of 0, 1, 2, 3, 4 voxels in the x-direction. Referring to FIG. 2B, the effect of compute point position is shown on the spherical surface of the normalized extended Poisson kernel, corresponding to PEAL compute point=1, 2, 3, and 4, all with kernel radius=6 voxels. In this non-limiting example, the compute point (black dot) is placed in +x direction (y=0, z=0). The compute point can be placed at any values of x,y,z so that distance from the origin to the compute point is less than the radius.

Thus, the PEAL kernel is particularly advantageous at certain applications of QSM background field removal, such as the edges of a VOI, or other situations where the voxels on one side of an area have much higher SNR than voxels on the other side. Using compute points farther away from the center of the kernel provides the ability to get closer to an edge, but that advantage should be balanced with SNR considerations as the voxel weighting grows more unequal with more asymmetrically located compute points.

To illustrate this, the non-limiting examples were performed for background field removal in abdominal QSM. A cylinder of radius=12 voxels was placed in a 128×128×128 matrix, at a central location, and at various locations near the VOI edge (distance between the cylinder edge and the VOI edge=1, 2, 3 . . . 6 voxels). To model hepatic iron overload, the true magnetic susceptibility in voxels within the cylinder was set to +5 ppm, and it was set to 0 in all other voxels. A liver with iron overload can have susceptibility difference from surrounding tissue up to +9 ppm. Phase data were generated from this susceptibility distribution using the forward dipole calculation. Note that a field map in Hz can be converted to unwrapped phase data in radians by multiplying by $2\pi\Delta TE$. Kernels of radius=6 voxels were generated for LBV, SHARP, RESHARP; PDF was also run. PEAL kernels for radius=6 and compute points 1, 2, 3, 4, 5 voxels away from the kernel center were also generated.

Comparison of the relative performance of each method was made by calculating the error (difference) in the estimated phase after background field removal and the simulated phase before background field removal. However, phase errors do not directly translate into QSM errors. In order to quantify the susceptibility error related to each background field removal method, dipole inversion was performed, with the cylindrical region constrained to one constant value, and the surrounding region constrained to 0, In this way, a single, estimated susceptibility value was produced for each 128×128×128 test case.

Figure 3A:
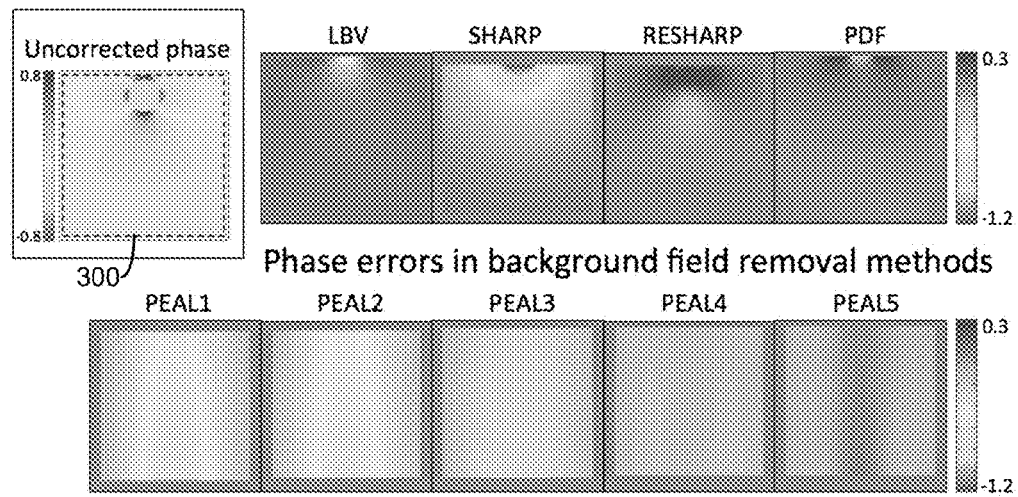
FIG. 3A is a series of phase maps illustrating errors for a plurality of different techniques, including techniques in accordance with the present disclosure.
Figure 3B:
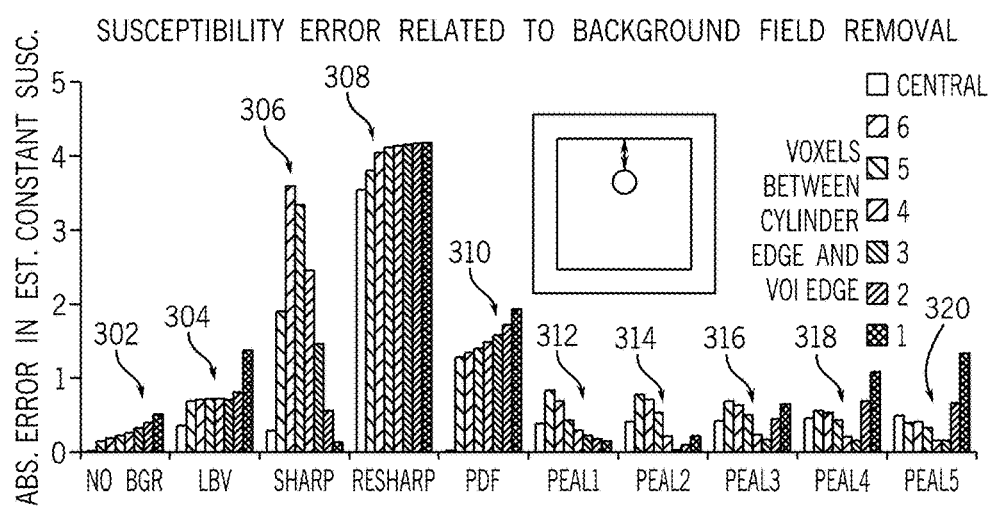
FIG. 3B is a bar graph showing susceptibility error related to background field removal using a plurality of different techniques, including techniques in accordance with the present disclosure.

The phase map errors for the cylinder located 3 voxels from the edge of the VOI are shown in FIG. 3A. A dotted line 300 in the uncorrected phase shows the extent of the VOI, i.e., the uneroded mask. As can be seen, LBV, SHARP, RESHARP, and PDF all lead to focal errors near the edge. The results of the PEAL method, however, show only small errors that have little variation across the VOI. Note the changing location of eroded masks with PEAL compute point. The estimated constant susceptibility errors within the cylinder are shown in FIG. 3B. The first group of bars 302 shows the error without any background field removal. LBV 304, RESHARP 308, and PDF 310 have errors that increase as the cylinder approaches the VOI edge. SHARP 306 also has high errors in that region. The PEAL methods 312, 314, 316, 318, 320 have the smallest overall errors near the edge, while the error in the central location is comparable to LBV and SHARP. The high errors in RESHARP 308 are due to the large cylinder size; a smaller cylinder or a larger matrix size leads to much smaller RESHARP errors.

Figure 4:
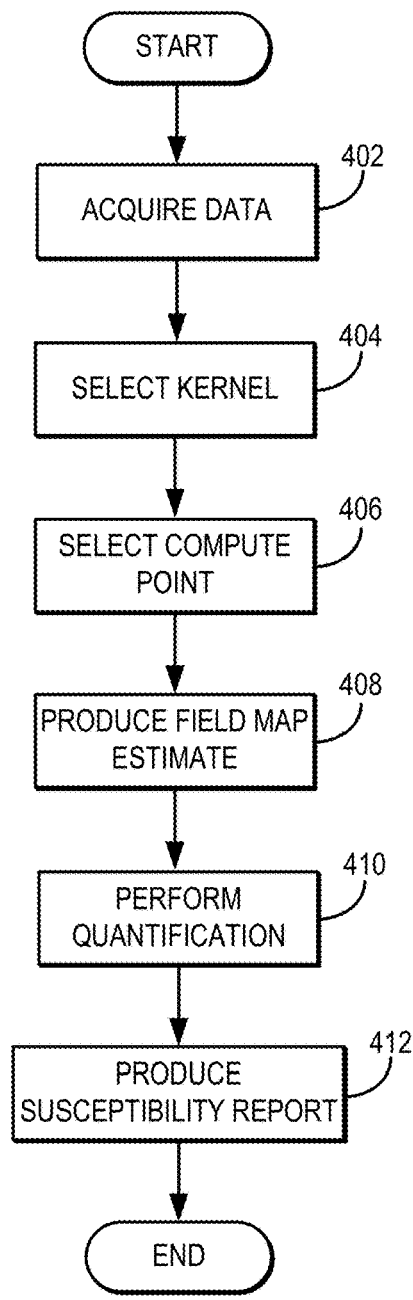
FIG. 4 is a flowchart setting forth some example steps of a method for performing QSM in accordance with the present disclosure.

Referring to FIG. 4, one example of a process for using the above-described techniques will be described. At process block 402, image data is acquired form a subject using a magnetic resonance imaging (MRI) system, such as will be described with respect to FIG. 5. At process block 404, a desired kernel is selected. As described above, the present disclosure provides the extended Poisson kernel may be used, which is defined over the volume of a sphere. Upon selecting the extended Poisson kernel one can select a kernel size and a compute point location. That is, as advantageously provided by the extended Poisson kernel, one can select a size for the kernel and then any point, $\vec{x}$, may be selected at process block 406 as a compute point for the extended Poisson kernel, not just the center point. However, as described above, the center point may be selected as the compute point, in which case the extended Poisson kernel serves to provide the results of the SHARP kernel.

Notably, process block 406 may be repeated multiple times to perform multiple convolutions. In this case, the multiple convolutions may be combined in a weighted sum. As one non-limiting example, a variety or even all possible angles can be tabulated from kernel to nearest edge voxel. Then a variety or even all possible kernels can be created with those angles and the convolutions performed with the kernels. The convolutions can then be combined with, for example, Gaussian weighting.

Whether a single compute point and convolution is performed or multiple convolutions are combined in a weighted sum, at process block 408, a field map estimate is produced. The field map estimate may be a spatial distribution of susceptibility. In one non-limiting example, a gradient echo (GRE) pulse sequence may be used to acquire the imaging data at process block 402. In this non-limiting example, a signal model for a GRE acquisition can be modeled as:

$$s(t_n) = A e^{-t_n R^*_2} e^{-j 2\pi B_T + \sigma} \quad \text{Eqn. 12}$$

where s is the signal at the echo time $t_n$, A is the SNR at "time 0", $R^*_2$ is the $1/T_2^*$ decay, $B_T$ is the total measured field inhomogeneity, and $\sigma$ is the complex-valued Gaussian-distributed noise with variance of 1. The parameters A, $f_B$, and $R^*_2$ can be estimated from the observed signal s on a per-voxel basis, using an iterative least-squares algorithm.

Note that the field map $B_T$ is the unwrapped phase information. The field map produced at process block 408 can be use in a desired QSM process, to perform background field removal and dipole inversion. Thus, at process block 412 a susceptibility report is generated. This susceptibility report may be a text report or image/map. For example, a forward transform of the spatial distribution of susceptibility with background fields removed or suppressed can be performed to yield a susceptibility map.

Figure 5:
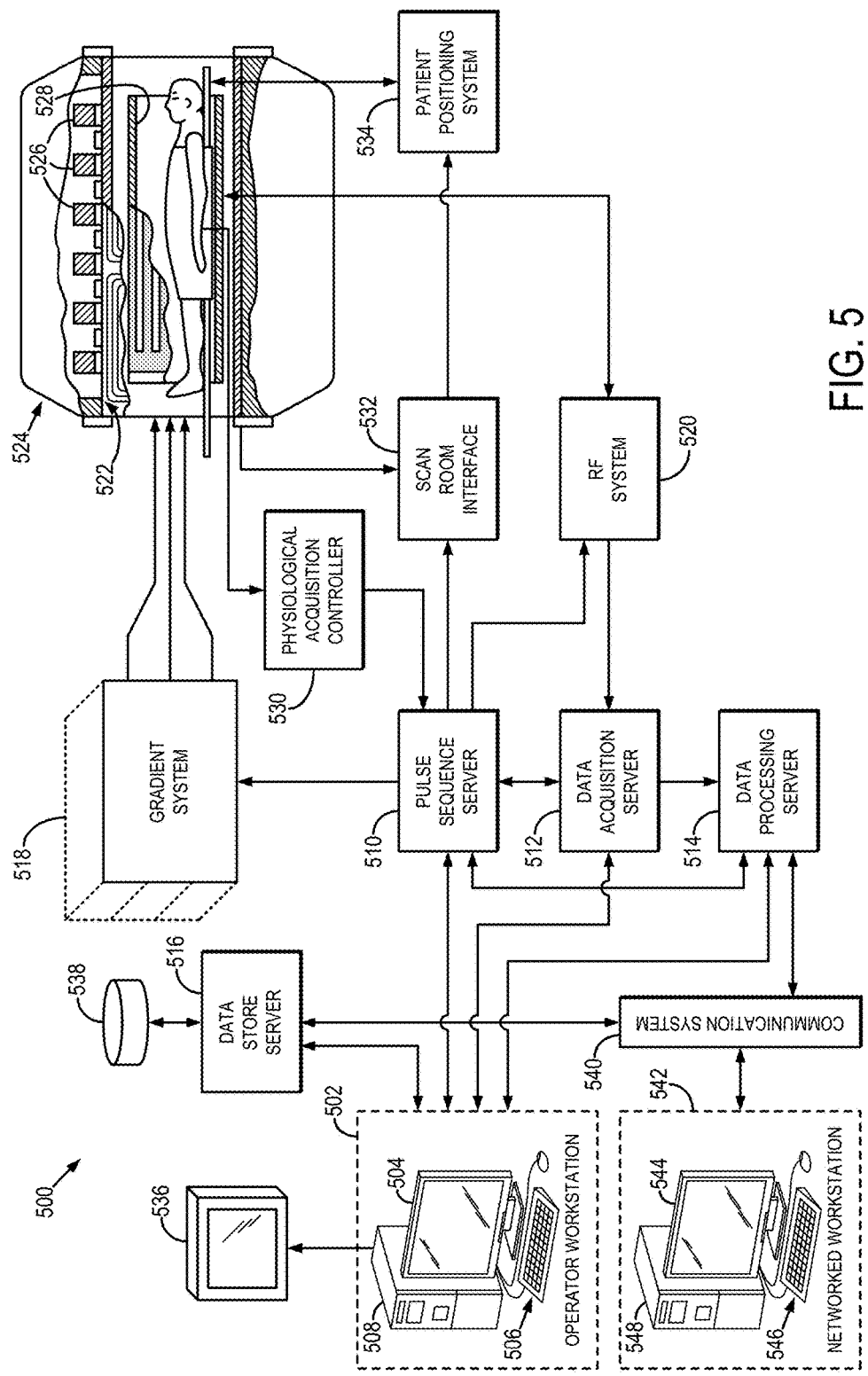
FIG. 5 is a block diagram of an example of a magnetic resonance imaging ("MRI") system configured to perform in accordance with the present disclosure.

Referring now to FIG. 5, an example of a magnetic resonance imaging ("MRI") system 500 configured to carryout the above-described processes is illustrated. The MRI system 500 includes a workstation 502 having a display 504 and a keyboard 506. The workstation 502 includes a processor 508, such as a commercially available programmable machine running a commercially available operating system. The workstation 502 provides the operator interface that enables scan prescriptions to be entered into the MRI system 500. The workstation 502 is coupled to four servers: a pulse sequence server 510; a data acquisition server 512; a data processing server 514; and a data store server 516. The workstation 502 and each server 510, 512, 514, and 516 are connected to communicate with each other.

The pulse sequence server 510 functions in response to instructions downloaded from the workstation 502 to operate a gradient system 518 and a radiofrequency ("RF") system 520. Gradient waveforms necessary to perform the prescribed scan are produced and applied to the gradient system 518, which excites gradient coils in an assembly 522 to produce the magnetic field gradients $G_x$, $G_y$, and $G_z$ used for position encoding MR signals. The gradient coil assembly 522 forms part of a magnet assembly 524 that includes a polarizing magnet 526 and a whole-body RF coil 528.

RF excitation waveforms are applied to the RF coil 528, or a separate local coil (not shown in FIG. 5), by the RF system 520 to perform the prescribed magnetic resonance pulse sequence. Responsive MR signals detected by the RF coil 528, or a separate local coil, are received by the RF system 520, amplified, demodulated, filtered, and digitized under direction of commands produced by the pulse sequence server 510. The RF system 520 includes an RF transmitter for producing a wide variety of RF pulses used in MR pulse sequences. The RF transmitter is responsive to the scan prescription and direction from the pulse sequence server 510 to produce RF pulses of the desired frequency, phase, and pulse amplitude waveform. The generated RF pulses may be applied to the whole body RF coil 528 or to one or more local coils or coil arrays.

The RF system 520 also includes one or more RF receiver channels. Each RF receiver channel includes an RF preamplifier that amplifies the MR signal received by the coil 528 to which it is connected, and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2} \quad \text{Eqn. 13}$$

and the phase of the received MR signal may also be determined:

$$\varphi = \tan^{-1}\left(\frac{Q}{I}\right). \quad \text{Eqn. 14}$$

The pulse sequence server 510 also optionally receives patient data from a physiological acquisition controller 530. The controller 530 receives signals from a number of different sensors connected to the patient, such as electrocardiograph ("ECG") signals from electrodes, or respiratory signals from a bellows or other respiratory monitoring device. Such signals are typically used by the pulse sequence server 510 to synchronize, or "gate," the performance of the scan with the subject's heart beat or respiration.

The pulse sequence server 510 also connects to a scan room interface circuit 532 that receives signals from various sensors associated with the condition of the patient and the magnet system. It is also through the scan room interface circuit 532 that a patient positioning system 534 receives commands to move the patient to desired positions during the scan.

The digitized MR signal samples produced by the RF system 520 are received by the data acquisition server 512. The data acquisition server 512 operates in response to instructions downloaded from the workstation 502 to receive the real-time MR data and provide buffer storage, such that no data are lost by data overrun. In some scans, the data acquisition server 512 does little more than pass the acquired MR data to the data processor server 514. However, in scans that require information derived from acquired MR data to control the further performance of the scan, the data acquisition server 512 is programmed to produce such information and convey it to the pulse sequence server 510. For example, during prescans, MR data are acquired and used to calibrate the pulse sequence performed by the pulse sequence server 510. Also, navigator signals may be acquired during a scan and used to adjust the operating parameters of the RF system 520 or the gradient system 518, or to control the view order in which k-space is sampled. In all these examples, the data acquisition server 512 acquires MR data and processes it in real-time to produce information that is used to control the scan.

The data processing server 514 receives MR data from the data acquisition server 512 and processes it in accordance with instructions downloaded from the workstation 502. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 514 are conveyed back to the workstation 502 where they are stored. Images are output to operator display 512 or a display 536 that is located near the magnet assembly 224 for use by attending physicians. Batch mode images or selected real time images are stored in a host database on disc storage 538. When such images have been reconstructed and transferred to storage, the data processing server 514 notifies the data store server 516 on the workstation 502. The workstation 502 may be used by an operator to archive the images, produce films, or send the images via a network to other facilities.

Thus, a system and method is provided to control background susceptibility noise and improve the results of QSM techniques, particularly in anatomical areas that include various fields, such as the abdomen (liver), portions of the head and brain near the sinuses or the external air, heart or other organs near the lungs or other areas near air-tissue interfaces, or tissue near metal, ceramic, or other implants. The technique is based on using harmonic function theory to correct for background field effects.

By providing the flexibly to select a "compute point" specific to spatial orientation of air-tissue interfaces or known variations in fields, the system and methods provided herein yield superior results to traditional background field control and, thereby superior QSM results.

The present invention has been described in terms of one or more preferred embodiments, and it should be appreciated that many equivalents, alternatives, variations, and modifications, aside from those expressly stated, are possible and within the scope of the invention.

I claim:

1. A method for determining a spatial distribution of susceptibility in a subject using a magnetic resonance imaging (MRI) system, wherein the method includes steps comprising:
   a) directing the MRI system to acquire imaging data from an imaging volume within a subject, wherein the imaging volume is subject to both background fields ($B_B$) originating outside the imaging volume and local fields ($B_L$) originating from tissue within the imaging volume;
   b) selecting a size and non-central compute point for an extended Poisson kernel to be applied to the imaging data;
   c) subtracting from a delta function to control the background fields ($B_B$) but not the local fields ($B_L$); and
   d) producing a susceptibility report attributable to the local fields ($B_L$).

2. The method of claim 1 further comprising sampling the extended Poisson kernel at discrete points.

3. The method of claim 2 further comprising unequally weighting voxels within the extended Poisson kernel.

4. The method of claim 3 wherein voxels closer to the compute point are weighted more heavily than voxels farther from the compute point.

5. The method of claim 1 wherein the image volume includes tissue proximate to at least one of air or an implant, such that the background fields ($B_B$) are attributable at least partially to the air or the implant.

6. The method of claim 5 wherein the tissue includes one of a liver, a heart, a brain, or an abdomen of the subject.

7. The method of claim 1 wherein the extended Poisson kernel is applied for a sphere ($P_0$) and is given by:

$$P_0(\overset{r}{x}, \overset{r}{r}) = \begin{cases} \dfrac{1 - |\overset{r}{x}|^2 |\overset{r}{r}|^2}{\left(1 - 2\overset{r}{x}g\overset{r}{r} + |\overset{r}{x}|^2|\overset{r}{r}|^2\right)^{3/2}} & \text{if } |\overset{r}{x}| < 1 \text{ and } |\overset{r}{r}| \leq 1 \\ 0, & \text{otherwise} \end{cases};$$

where $\overset{r}{x}$ is a point in the extended Poisson kernel, $\overset{r}{r}$ is the compute point.

8. The method of claim 7 further comprising constructing a Poisson estimation for accommodating local fields (PEAL) kernel by sampling the extended Poisson kernel at discrete points given by $\overset{r}{X}$ and $\overset{r}{R}$:

$$\hat{P}_0[\overset{r}{X}, \overset{r}{R}] = \frac{3}{4\pi a^3} P_0(\overset{r}{X}a, \overset{r}{R}a);$$

where a is a radius of the extended Poisson kernel in voxels.

9. The method of claim 8 wherein subtracting from the delta function takes a form:
$$P[\overset{r}{X}, \overset{r}{R}] = \delta - \hat{X}_0[\overset{r}{R}, \overset{r}{R}].$$

10. The method of claim 1 further comprising repeating steps b) and c) for a plurality of locations to produce the susceptibility report attributable to the local fields ($B_L$) across the volume of interest.

11. A magnetic resonance imaging system comprising:
   a static magnetic field configured to be applied across at least an imaging volume of a subject to be imaged;
   a gradient system configured to apply gradient fields to the imaging volume of the subject to be imaged;
   a radio frequency (RF) system configured to deliver RF energy to the subject and receive imaging data from the subject during an imaging process;
   a computer system configured to:
      control the gradient system and the RF system to perform the imaging process and acquire the imaging data from the imaging volume of the subject, wherein the imaging volume is subject to both background fields ($B_B$) originating outside the imaging volume and local fields ($B_L$) originating from tissue within the imaging volume;
      select a size and non-central compute point for an extended Poisson kernel to be applied to the imaging data;
      produce a magnetic susceptibility map of the imaging volume having suppressed the background fields ($B_B$) but not the local fields ($B_L$); and
      using the magnetic susceptibility map, generate a quantitative susceptibility map of the imaging volume.

12. The system of claim 11 wherein the computer system is further configured to sample the extended Poisson kernel at discrete points.

13. The system of claim 11 wherein the computer system is further configured to unequally weight voxels within the extended Poisson kernel.

14. The system of claim 13 wherein the computer system is further configured to weight voxels closer to the compute point more heavily than voxels farther from the compute point.

15. The system of claim 11 wherein the image volume includes tissue proximate to at least one of air or an implant, such that the background fields ($B_B$) are attributable at least partially to the air or the implant.

16. The system of claim 15 wherein the tissue includes one of a liver, a heart, a brain, or an abdomen of the subject.

17. The system of claim 11 wherein the computer system is further configured to apply the extended Poisson kernel to a sphere ($P_0$) to be given by:

$$P_0(\overset{r}{x}, \overset{r}{r}) = \begin{cases} \dfrac{1 - |\overset{r}{x}|^2 |\overset{r}{r}|^2}{\left(1 - 2\overset{r}{x}g\overset{r}{r} + |\overset{r}{x}|^2|\overset{r}{r}|^2\right)^{3/2}} & \text{if } |\overset{r}{x}| < 1 \text{ and } |\overset{r}{r}| \leq 1 \\ 0, & \text{otherwise} \end{cases};$$

where $\overset{r}{X}$ is a point in the extended Poisson kernel, $\overset{r}{R}$ is the compute point.

18. The system of claim 17 wherein the computer system is further configured to construct a Poisson estimation for ascertaining local fields (PEAL) kernel by sampling the extended Poisson kernel at discrete points given by $\vec{X}$ and $\vec{R}$:

$$\hat{P}_0[\vec{X}, \vec{R}] = \frac{3}{4\pi a^3} P_0(\vec{x}a, \vec{r}a);$$

where a is a radius of the extended Poisson kernel in voxels.

19. The system of claim 18 wherein the computer system is further configured to subtract from a delta function to control the background fields ($B_B$) but not the local fields ($B_L$) as:

$$P[\vec{X}, \vec{R}] = \delta - \vec{X}_0[\vec{R}, \vec{R}].$$

20. The system of claim 19 wherein the computer system is further configured to select a size and non-central compute point for a plurality of extended Poisson kernels to be applied to the imaging data and, for each, produce a susceptibility report attributable to the local fields ($B_L$) across the volume of interest.

* * * * *